United States Patent
Byeon (10) Patent No.: US 8,035,420 B2
(45) Date of Patent: Oct. 11, 2011

(54) SEMICONDUCTOR DEVICE AND METHOD FOR OPERATING THE SAME

(75) Inventor: Sang-Yeon Byeon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/704,871

(22) Filed: Feb. 12, 2010

(65) Prior Publication Data

US 2011/0156754 A1  Jun. 30, 2011

(30) Foreign Application Priority Data

Dec. 30, 2009  (KR) .................. 10-2009-0134833

(51) Int. Cl.
*H03K 19/096* (2006.01)
*H03K 19/094* (2006.01)
*H03K 3/286* (2006.01)

(52) U.S. Cl. ........... 326/96; 326/115; 327/210; 327/214

(58) Field of Classification Search .................... 326/68, 326/82, 83, 86, 87, 93, 96, 115–120, 126, 326/127; 327/108, 109, 208–212, 214, 215, 327/224, 225

See application file for complete search history.

(56) References Cited

U.S. PATENT DOCUMENTS

| | | | | |
|---|---|---|---|---|
| 6,275,880 | B1 * | 8/2001 | Quinlan et al. | 710/100 |
| 7,777,521 | B2 * | 8/2010 | Hanna et al. | 326/68 |
| 2008/0129329 | A1 * | 6/2008 | Marsh et al. | 326/9 |
| 2008/0144760 | A1 * | 6/2008 | Song et al. | 375/371 |
| 2008/0237512 | A1 * | 10/2008 | Lin | 251/61.5 |
| 2009/0174455 | A1 * | 7/2009 | Dimitriu et al. | 327/295 |

OTHER PUBLICATIONS

M. Jeeradit et al., "Characterizing Sampling Aperture of Clocked Comparators", 2008 Symposium on VLSI Circuits Digest of Technical Papers, pp. 68-69.

* cited by examiner

*Primary Examiner* — Shawki Ismail
*Assistant Examiner* — Dylan White
(74) *Attorney, Agent, or Firm* — IP&T Group LLP (57) ABSTRACT

A semiconductor device includes a plurality of CML buffering units configured to buffer, in parallel, a plurality of serially applied data signals to CML levels in a sequence responding to multi-phase source clocks; and a CMOS amplification block configured to amplify a plurality of buffered data signals, sequentially outputted from the plurality of CML buffering units, to CMOS levels in response to the multi-phase source clocks, and output amplified data signals in parallel at the same timing.

22 Claims, 8 Drawing Sheets

SEMICONDUCTOR DEVICE AND METHOD FOR OPERATING THE SAME

CROSS-REFERENCE TO RELATED APPLICATIONS

The present application claims priority of Korean Patent Application No. 10-2009-0134833, filed on Dec. 30, 2009, which is incorporated herein by reference in its entirety.

BACKGROUND OF THE INVENTION

Exemplary embodiments of the present invention relate to a semiconductor design technology, and more particularly, to a receiver circuit for receiving a data signal in a semiconductor device.

A typical semiconductor device includes a receiver circuit configured to receive an external data signal.

Figure 1:
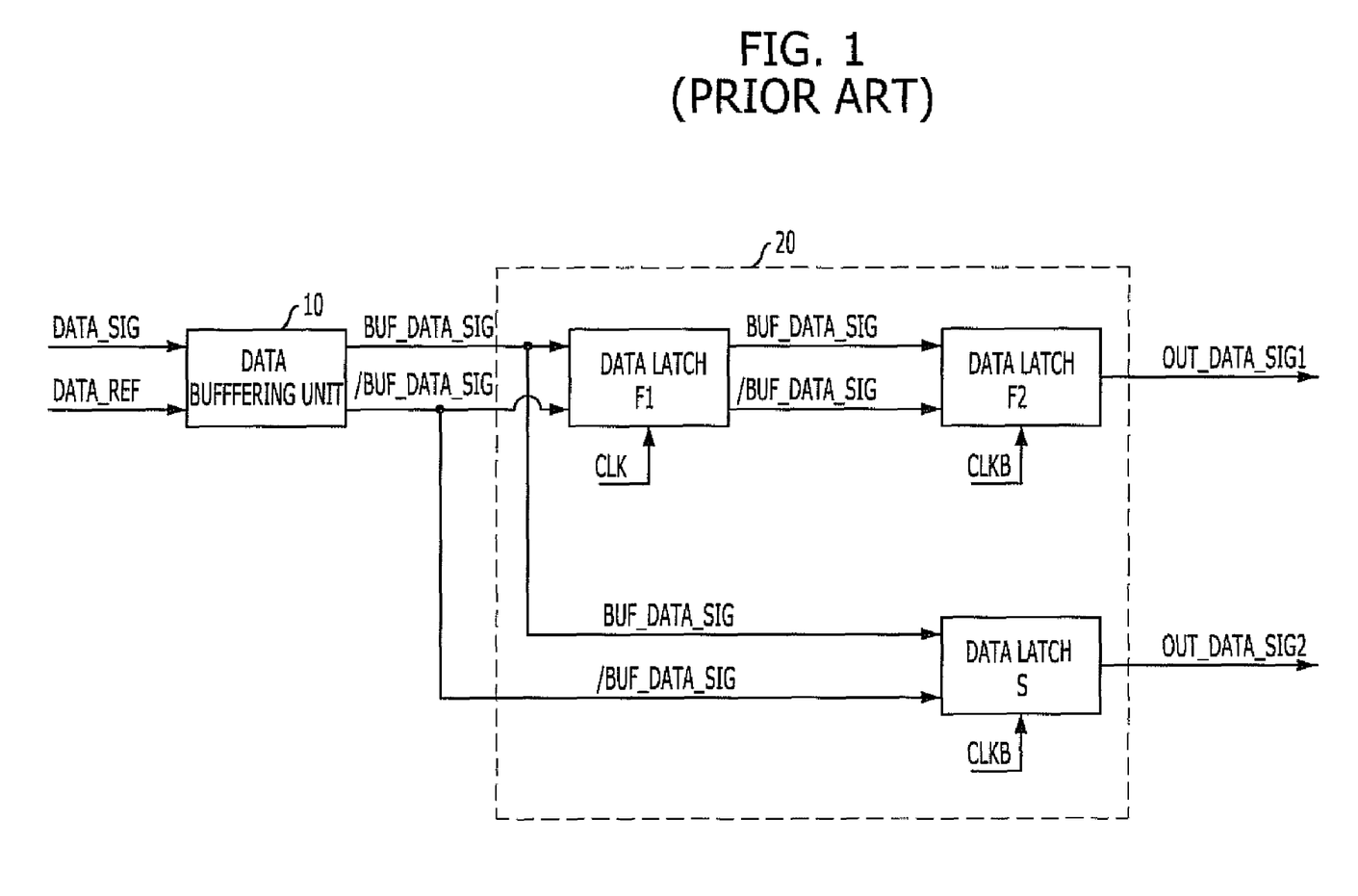
FIG. 1 is a block diagram illustrating a conventional circuit for receiving data in a semiconductor device.

FIG. 1 is a block diagram illustrating a conventional circuit for receiving data in a semiconductor device.

Referring to FIG. 1, the receiver circuit includes a data buffering unit 10 and a data synchronization unit 20. The data buffering unit 10 is configured to buffer an external data signal DATA_SIG in a CMOS region based on a voltage level of a data reference signal DATA_REF, determine the logic level of the external data signal DATA_SIG, and amplify a swing width of the external data signal DATA_SIG. When the external data signal DATA_SIG is composed of 1 bit, the data synchronization unit 20 is configured to output buffered data signals BUF_DATA_SIG and /BUF_DATA_SIG, which are outputted from the data buffering unit 10, in synchronism with source clocks CLK and CLKB. When the external data signal DATA_SIG is composed of multi-bits which are serially inputted, the data synchronization unit 20 is configured to output the buffered data signals BUF_DATA_SIG and /BUF_DATA_SIG, which are outputted from the data buffering unit 10, in synchronism with multi-phase source clocks CLK and CLKB, such that the multi-bits are outputted in parallel.

For reference, when the external data signal DATA_SIG is composed of 2 bits which are serially inputted, the data synchronization unit 20 illustrated in FIG. 1 outputs the buffered data signals BUF_DATA_SIG and /BUF_DATA_SIG, which are outputted from the data buffering unit 10, in synchronism with the multi-phase source clocks CLK and CLKB, such that the 2 bits are outputted in parallel.

In the semiconductor device having the above-described configuration, variation in power supplied to the data buffering unit 10 and the data synchronization unit 20 may change the time taken until the data buffering unit 10 buffers the data signal DATA_SIG and outputs the buffered data signals BUF_DATA_SIG and /BUF_DATA_SIG.

That is to say, if the level of a power supply voltage (VDD) supplied to the data buffering unit 10 rises (i.e., the power supplied thereto becomes strong), the operating speed of the circuit included in the data buffering unit 10 becomes relatively faster than when normal power is supplied. Hence, the data signals BUF_DATA_SIG and /BUF_DATA_SIG buffered at a timing earlier than the timing at which the data signal DATA_SIG is applied are generated.

Conversely, if the level of the power supply voltage (VDD) supplied to the data buffering unit 10 drops (i.e., the power supplied thereto becomes weak), the operating speed of the circuit included in the data buffering unit 10 becomes relatively slower than when normal power is supplied. Hence, the data signals BUF_DATA_SIG and /BUF_DATA_SIG buffered at a timing later than the timing at which the data signal DATA_SIG is applied are generated.

In addition, the duty ratios of the buffered data signals BUF_DATA_SIG and /BUF_DATA_SIG outputted from the data buffering unit 10 are distorted.

In designing the data buffering unit 10, it is preferred that the duty ratios of the buffered data signals BUF_DATA_SIG and /BUF_DATA_SIG outputted at a specific target level of the power supply voltage (VDD) are matched with each other. However, if the level of the power supply voltage (VDD) is higher or lower than the specific target level, threshold voltages of transistors included in the data buffering unit 10 increase or decrease, causing distortion in the duty ratios of the buffered data signals BUF_DATA_SIG and /BUF_DATA_SIG.

Furthermore, if the data synchronization unit 20 is operated while receiving the buffered data signals BUF_DATA_SIG and /BUF_DATA_SIG whose generation timing is changed and whose duty ratios are distorted by the variation in the supplied power, it cannot precisely sample the buffered data signals BUF_DATA_SIG and /BUF_DATA_SIG in synchronism with the source clocks CLK and CLKB no matter how well it operates.

Moreover, in the data synchronization unit 20, a sampling point also changes according to the variation in the supplied power. Thus, it may be further impossible to precisely sample the buffered data signals BUF_DATA_SIG and /BUF_DATA_SIG.

As such, if the receiver circuit receives the data signal DATA_SIG applied when power noise occurs, a setup/hold time (tDSH) characteristic of the conventional semiconductor device is degraded, possibly causing the semiconductor device to malfunction.

SUMMARY OF THE INVENTION

Exemplary embodiments of the present invention are directed to a receiver circuit which can stably receive data even when power noise occurs in a semiconductor device.

In accordance with an embodiment of the present invention, a semiconductor device includes a plurality of CML buffering units configured to buffer, in parallel, a plurality of serially applied data signals to CML levels in a sequence responding to multi-phase source clocks, and a CMOS amplification block configured to amplify a plurality of buffered data signals, sequentially outputted from the plurality of CML buffering units, to CMOS levels in response to the multi-phase source clocks, and output amplified data signals in parallel at the same timing.

In accordance with another embodiment of the present invention, a semiconductor device includes a first CML buffering unit configured to buffer a first data signal, which is applied relatively early among a plurality of serially applied data signals, to a CML level in synchronism with multi-phase source clocks, a second CML buffering unit configured to buffer a second data signal, which is applied relatively late among the plurality of data signals, to a CML level in synchronism with the multi-phase source clocks, a first CMOS amplification block configured to amplify a first buffered data signal outputted from the first CML buffering unit, to a CMOS level in response to the multi-phase source clocks to obtain an amplified first buffered data signal, and output the amplified first buffered data signal at a certain output timing, and a second CMOS amplification block configured to amplify a second buffered data signal outputted from the second CML buffering unit, to a CMOS level in response to the multi-phase source clocks to obtain an amplified second buffered data signal, and output the amplified second buffered data signal at the certain output timing.

In accordance with yet another embodiment of the present invention, a method for operating a semiconductor device includes applying a plurality of data signals in series, buffering the plurality of data signals to CML levels at a plurality of sequential timings that are determined in correspondence to multi-phase source clocks, and generating a plurality of CML buffered data signals, amplifying sequentially the plurality of CML buffered data signals to CMOS levels in response to the multi-phase source clocks, and generating a plurality of CMOS amplified data signals, and outputting the plurality of CMOS amplified data signals at one timing that is determined according to the multi-phase source clocks.

DESCRIPTION OF SPECIFIC EMBODIMENTS

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
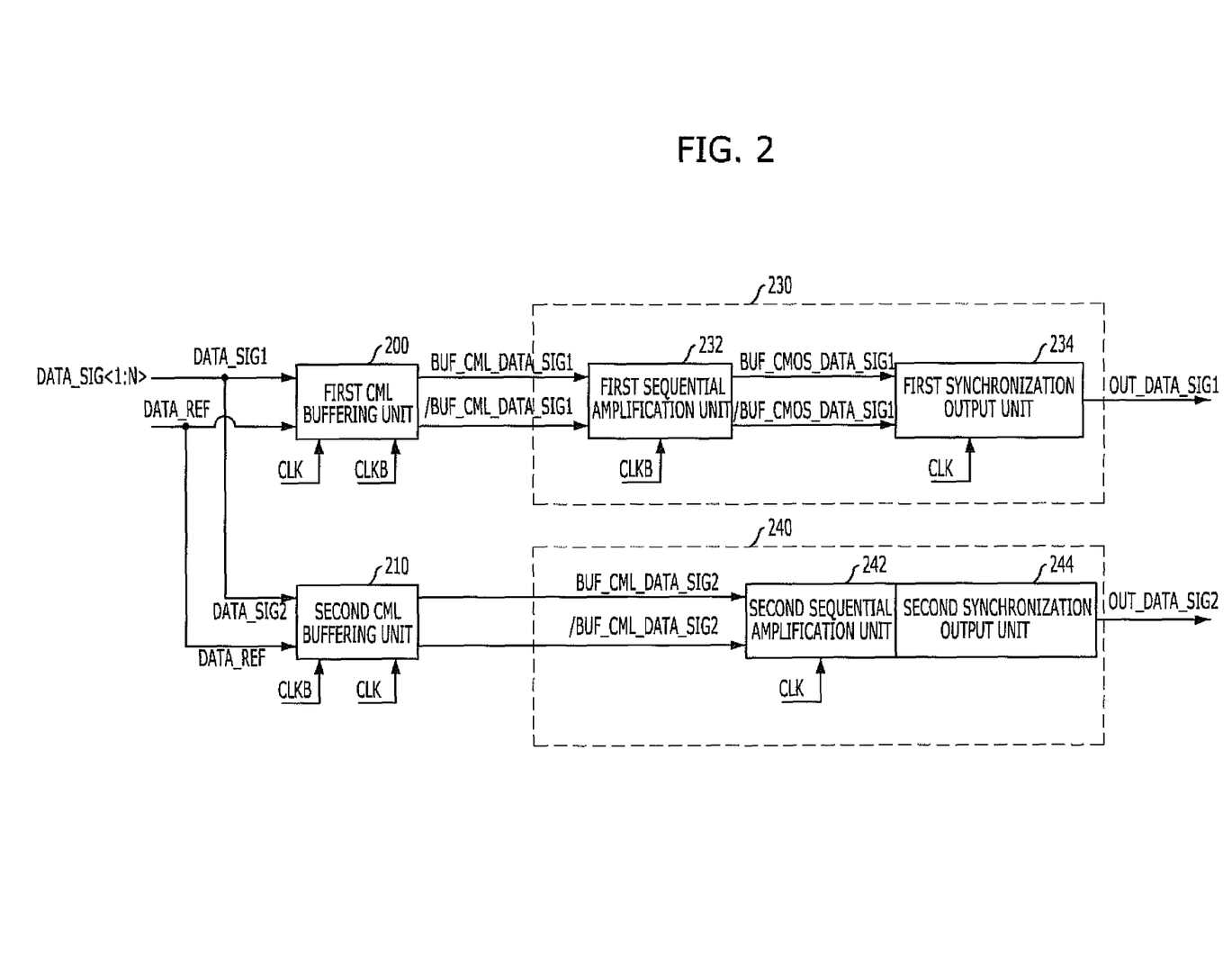
FIG. 2 is a block diagram illustrating a circuit for receiving data in a semiconductor device in accordance with an embodiment of the present invention.

FIG. 2 is a block diagram illustrating a circuit for receiving data in a semiconductor device in accordance with an embodiment of the present invention.

Referring to FIG. 2, a circuit for receiving data in a semiconductor device in accordance with an embodiment of the present invention includes a first CML buffering unit 200, a second CML buffering unit 210, a first CMOS amplification block 230, and a second CMOS amplification block 240. The first CML buffering unit 200 is configured to buffer a first data signal DATA_SIG1, applied relatively early among a plurality of serially applied data signals DATA_SIG<1:N>, to a CML level in synchronism with multi-phase source clocks CLK and CLKB, and output a first buffered data signal BUF_CML_DATA_SIG1. The second CML buffering unit 210 is configured to buffer a second data signal DATA_SIG2, applied relatively later among the plurality of data signals DATA_SIG<1:N>, to a CML level in synchronism with the multi-phase source clocks CLK and CLKB, and output a second buffered data signal BUF_CML_DATA_SIG2. The first CMOS amplification block 230 is configured to amplify the first buffered data signal BUF_CML_DATA_SIG1, outputted from the first CML buffering unit 200, to a CMOS level in response to the multi-phase source clocks CLK and CLKB, and output a first amplified data signal BUF_CMOS_DATA_SIG1 at a certain output timing. The second CMOS amplification block 240 is configured to amplify the second buffered data signal BUF_CML_DATA_SIG2, outputted from the second CML buffering unit 210, to a CMOS level in response to the multi-phase source clocks CLK and CLKB, and output a second amplified data signal BUF_CMOS_DATA_SIG2 (not shown) at a certain output timing.

The multi-phase source clocks CLK and CLKB include a first multi-phase source clock CLKB that has a relatively high phase, and a second multi-phase source clock CLK that has a relatively low phase. The first multi-phase source clock CLKB and the second multi-phase source clock CLK have opposite activation intervals.

For example, of the multi-phase source clocks CLK and CLKB, the phase of the first multi-phase source clock CLKB may be 180° and is the phase of the second multi-phase source clock CLK may be 0°. Therefore, it can be said that the phase of the first multi-phase source clock CLKB is higher than the phase of the second multi-phase source clock CLK.

The first CMOS amplification block 230 includes a first sequential amplification unit (SAFF) 232 and a first synchronization output unit (SAFF+SR) 234. The first sequential amplification unit (SAFF) 232 is configured to amplify the first buffered data signal BUF_CML_DATA_SIG1 to a CMOS level during the activation interval of the first multi-phase source clock CLKB, and output the first amplified data signal BUF_CMOS_DATA_SIG1. The first synchronization output unit (SAFF+SR) 234 is configured to wait until a certain output timing, during the activation interval of the second multi-phase source clock CLK, before outputting the first amplified data signal BUF_CMOS_DATA_SIG1 amplified to the CMOS level, as an output signal OUT_DATA_SIG1.

The second CMOS amplification block 240 includes a second sequential amplification unit (SAFF) 242 and a second synchronization output unit (SR) 244. The second sequential amplification unit (SAFF) 242 is configured to amplify the second buffered data signal BUF_CML_DATA_SIG2 to a CMOS level during the activation interval of the second multi-phase source clock CLK, and output the second amplified data signal BUF_CMOS_DATA_SIG2 (not shown). The second synchronization output unit (SR) 244 is configured to output the second amplified data signal BUF_CMOS_DATA_SIG2 at a certain output timing during the activation interval of the second multi-phase source clock CLK, as an output signal OUT_DATA_SIG2.

It is to be understood that both the first multi-phase source clock CLKB and the second multi-phase source clock CLK are applied to the first CMOS amplification block 230, such that the first CMOS amplification block 230 can operate in response to the first multi-phase source clock CLKB when amplifying the inputted first buffered data signal BUF_CML DATA_SIG1 to the CMOS level and can operate in response to the second multi-phase source clock CLK when outputting the first amplified data signal BUF_CMOS_DATA_SIG1 amplified to the CMOS level, as the output signal OUT_DATA_SIG1. Conversely, it is to be understood that only the second multi-phase source clock CLK is applied to the second CMOS amplification block 240, such that the second CMOS amplification block 240 can operate in response to the second multi-phase source clock CLK when amplifying the inputted second buffered data signal BUF_CML_DATA_SIG2 to the CMOS level and can operate in response to the second multi-phase source clock CLK when outputting the second amplified data signal BUF_CMOS_DATA_SIG2 amplified to the CMOS level, as the output signal OUT_DATA_SIG2.

The reason why the first CMOS amplification block 230 and the second CMOS amplification block 240 operate differently as described above is to ensure that the timing at which the output signal OUT_DATA_SIG1 is outputted from the first CMOS amplification block 230 and the timing at which the output signal OUT_DATA_SIG2 is outputted from the second CMOS amplification block 240 coincide with each other at the certain output timing, even though the timing at which the first buffered data signal BUF_CML_DATA_SIG1 is applied to the first CMOS amplification block 230 and the timing at which the second buffered data signal BUF_CML_DATA_SIG2 is applied to the second CMOS amplification block 240 are different from each other. In other words, since the timing at which the first buffered data signal BUF_CML_DATA_SIG1 is applied to the first CMOS amplification block 230 is determined in response to the second multi-phase source clock CLK, and the timing at which the second buffered data signal BUF_CML_DATA_SIG2 is applied to the second CMOS amplification block 240 is determined in response to the first multi-phase source clock CLKB, the two timings are different from each other. However, since both the timing at which the output signal OUT_DATA_SIG1 is outputted from the first CMOS amplification block 230 and the timing at which the output signal OUT_DATA_SIG2 is outputted from the second CMOS amplification block 240 are determined in response to to the second multi-phase source clock CLK, these two output timings coincide with each other.

Hence, the first CMOS amplification block 230 operates to amplify the first buffered data signal BUF_CML_DATA_SIG1 to the CMOS level during the activation interval of the first multi-phase source clock CLKB, wait until a certain output timing during the activation interval of the second multi-phase source clock CLK, and output the first amplified data signal BUF_CMOS_DATA_SIG1 amplified to the CMOS level, as the output signal OUT_DATA_SIG1. Conversely, the second CMOS amplification block 240 operates to amplify the second buffered data signal BUF_CML_DATA_SIG2 to the CMOS level during the activation interval of the second multi-phase source clock CLKB, and at the same time, output the second amplified data signal BUF_CMOS_DATA_SIG2 amplified to the CMOS level at the certain output timing during the activation interval of the second multi-phase source clock CLK, as the output signal OUT_DATA_SIG2.

Figure 3:
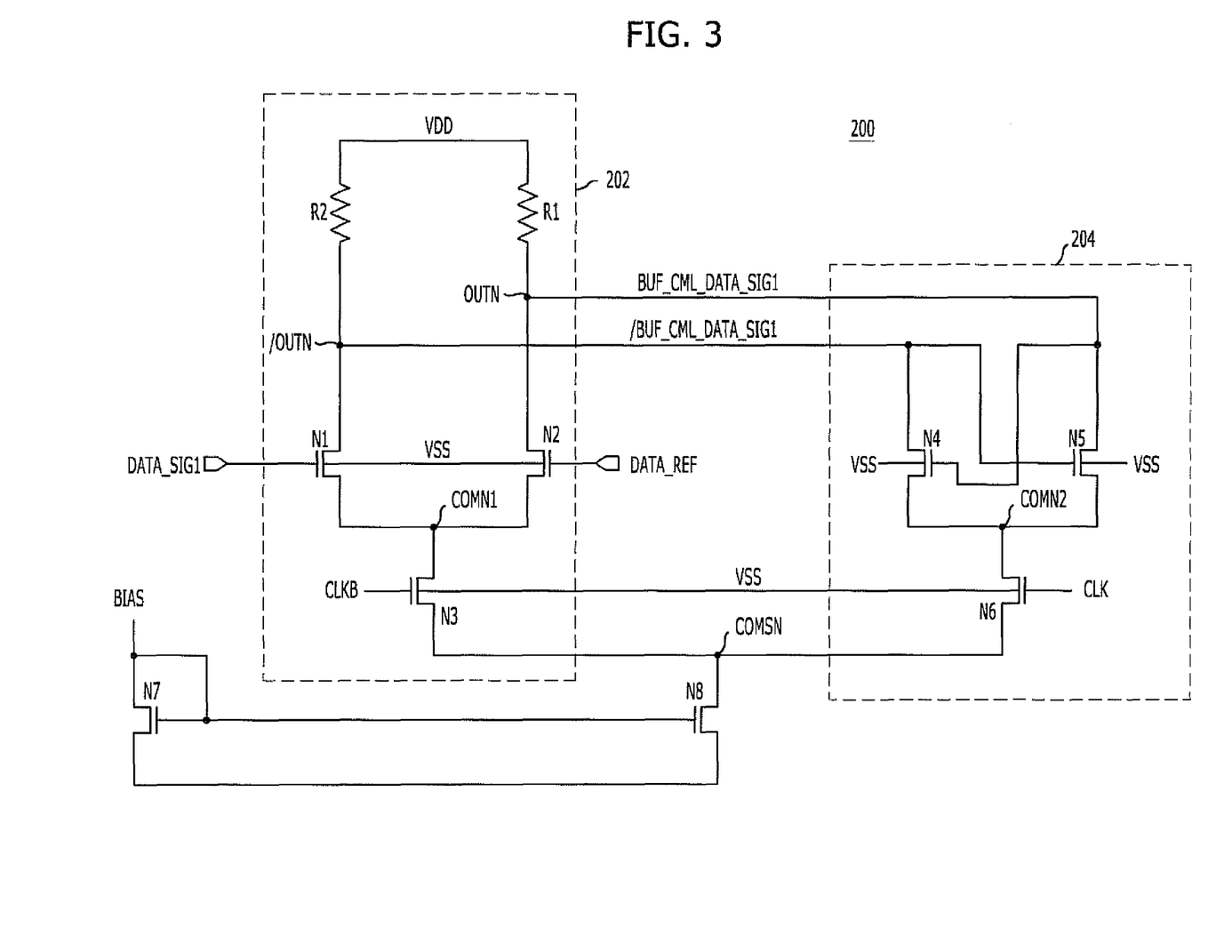
FIG. 3 is a circuit diagram illustrating a first CML buffering unit among the component elements of the circuit for receiving data in a semiconductor device in accordance with the embodiment of the present invention shown in FIG. 2.

FIG. 3 is a circuit diagram illustrating the first CML buffering unit among the component elements of the circuit for receiving data in a semiconductor device in accordance with the embodiment of the present invention shown in FIG. 2.

Referring to FIG. 3, the first CML buffering unit 200 in accordance with the embodiment of the invention includes a first data input section 202, and a first buffering section 204. The first data input section 202 is configured to receive a first data signal DATA_SIG1 among a plurality of data signals DATA_SIG<1:N> in response to the first multi-phase source clock CLKB. The first buffering section 204 is configured to buffer the first data signal DATA_SIG1, inputted through the first data input section 202, to the CML level in response to the second multi-phase source clock CLK, and output first buffered data signals BUF_CML_DATA_SIG1 and /BUF_CM L_DATA_SIG1.

Describing the first data input section 202 in further detail, the first data input section 202 includes a first NMOS transistor N1, a second NMOS transistor N2, a third NMOS transistor N3, a first fixed resistor R1, and a second fixed resistor R2. The first NMOS transistor N1 is configured to control the amount of current flowing between a second output node /OUTN connected to the drain thereof and a common node COMN1 connected to the source thereof, in response to the first data signal DATA_SIG1 applied to the gate thereof. The second NMOS transistor N2 is configured to control the amount of current flowing between a first output node OUTN connected to the drain thereof and the common node COMN1 connected to the source thereof, in response to a data reference signal DATA_REF applied to the gate thereof. The third NMOS transistor N3 is configured to control the amount of current flowing between the common node COMN1 connected to the drain thereof and a common source node COMSN connected to the source thereof, in response to the first multi-phase source clock CLKB applied to the gate thereof. The first fixed to resistor R1 is connected between a power supply voltage VDD and the first output node OUTN, and has a resistance value set to adjust the swing width of a signal to be outputted through the first output node OUTN. The second fixed resistor R2 is connected between the power supply voltage VDD and the second output node /OUTN, and has a resistance value set to adjust the swing width of a signal to be outputted through the second output node /OUTN.

Describing the first buffering section 204 in further detail, the first buffering section 204 includes a fourth NMOS transistor N4, a fifth NMOS transistor N5, and a sixth NMOS transistor N6. The fourth NMOS transistor N4 is configured to control the amount of current flowing between the second output node /OUTN of the first data input section 202 connected to the drain thereof and a common node COMN2 connected to the source thereof, in response to the first buffered data signal BUF_CML_DATA_SIG1 loaded on the first output node OUTN of the first data input section 202 and applied to the gate thereof. The fifth NMOS transistor N5 is configured to control the amount of current flowing between the first output node OUTN of the first data input section 202 connected to the drain thereof and the common node COMN2 connected to the source thereof, in response to the first buffered data signal /BUF_CML_DATA_SIG1 loaded on the second output node /OUTN of the first data input section 202 and applied to the gate thereof. The sixth NMOS transistor N6 is configured to control the amount of current flowing between the common node COMN2 connected to the drain thereof and the common source node COMSN connected to the source thereof, in response to the second multi-phase source clock CLK applied to the gate thereof.

Furthermore, a circuit section for causing the common source node COMSN to be connected with a ground voltage VSS in response to a bias voltage BIAS is illustrated in FIG. 3. As shown, the circuit may include a seventh NMOS transistor and an eighth NMOS transistor N8. Here, the seventh NMOS transistor N7 is coupled to the bias voltage BIAS, while the eighth NMOS transistor is coupled to the common source node COMSN. Moreover, the gates of the seventh and eighth NMOS transistors N7 and N8 are coupled to each other, as well as, to the bias voltage BIAS. Although this circuit section is provided in FIG. 3, because the bias voltage BIAS always maintains a logic high state in response to a power supply to the semiconductor device, it may be assumed in the embodiment of the invention that the ground voltage VSS is always connected to the common source node COMSN.

When observing the circuit of the first data input section 202 and the circuit of the first buffering section 204, it can be appreciated that their output nodes OUTN and /OUTN are substantially the same. In this regard, the voltage levels of the output nodes OUTN and /OUTN that are determined through the operation of the first data input section 202 and the voltage levels of the output nodes OUTN and /OUTN that are determined through the operation of the first buffering section 204 are different from each other as described below. Of course, the voltage levels of the output nodes OUTN and /OUTN that are finally outputted correspond to those outputted after completion of the operation of the first buffering section 204.

First, while the voltage levels of the output nodes OUTN and /OUTN that are determined through the first data input section 202 may vary depending upon whether the voltage level of the first data signal DATA_SIG1 is higher or lower than the voltage level of the data reference signal DATA_REF, the voltage levels of the output nodes OUTN and /OUTN can be defined by 'VDD−{the resistance value of R1 (or R2)*the magnitude of current flowing through R1 (or R2)}'. Thus, since the first resistor R1 and the second resistor R2 can be regarded as the same, the swing width of the voltage levels of the output nodes OUTN and /OUTN changes depending upon the magnitude of the current flowing through the first resistor R1, which is determined by the first NMOS transistor N1 in response to the voltage level of the first data signal DATA_SIG1, and the magnitude of the current flowing through the second resistor R2, which is determined by the second NMOS transistor N2 in response to the voltage level of the data reference signal DATA_REF. Due to this fact, since the actual maximum voltage level and minimum voltage level in the swing width are not stable, it cannot be considered that swing occurs within a CML region.

Further, while the voltage levels of the output nodes OUTN and /OUTN that are determined through the first buffering section 204 may vary depending upon whether the voltage level of the first output node OUTN is higher or lower than the voltage level of the second output node /OUTN, a maximum level of the voltage levels of the output nodes OUTN and /OUTN is the same as the power supply voltage VDD, and a minimum level can be defined by 'Vds of N1 (or N2)+2*Vth (N6 and N8)'. In other words, since the maximum voltage level of the output nodes OUTN and /OUTN is determined by the state in which the fourth NMOS transistor N4 or the fifth NMOS transistor N5 is completely turned off so that current does not flow through the off transistor, the maximum voltage level becomes the same as the power supply voltage VDD. Also, since the minimum voltage level of the output nodes OUTN and /OUTN is determined by the state in which the fourth NMOS transistor N4 or the fifth NMOS transistor N5 is completely turned on so that the maximum amount of current flows through the turned on transistor, the minimum voltage level will become the sum of the voltage level of the ground voltage VSS, the voltage Vds applied between the drain and the source of the fourth NMOS transistor N4 or the fifth NMOS transistor N5, and the threshold voltages (2*Vth) of the sixth NMOS transistor N6 and the bias NMOS transistor N8. In this way, since the actual maximum voltage level and minimum voltage level in the swing width of the output nodes OUTN and /OUTN are stably determined through the operation of the first buffering section 204 and the swing region thereof is defined by the voltage levels determined by the power supply voltage VDD and 'Vds of N1 (or N2)+2*Vth (N6 and N8)', it can be considered that the swing width of the output nodes OUTN and /OUTN corresponds to a CML region.

While not directly shown in the drawings, the configuration of the second CML buffering unit 210 is the same as that of the first CML buffering unit 200 shown in FIG. 3, except that input and output signals are different.

Accordingly, the second CML buffering unit 210 includes a second data input section and a second buffering section. The second data input section is configured to receive a second data signal DATA_SIG2 among the plurality of data signals DATA_SIG<1:N> in response to the second multi-phase source clock CLK. The second buffering section is configured to buffer the second data signal DATA_SIG2, inputted through the second data input section, to the CML level in response to the first multi-phase source clock CLKB, and output second buffered data signals BUF_CML_DATA_SIG2 and /BUF_CML_DATA_SIG2.

However, while the first CML buffering unit 200 and the second CML buffering unit 210 have the same configuration, their operations are opposite to each other as described below.

First, the first data input section 202 in the first CML buffering unit 200 receives the first data signal DATA_SIG1 among the plurality of data signals DATA_SIG<1:N> during an interval in which the first multi-phase source clock CLKB is activated and the second multi-phase source clock CLK is inactivated. However, the second data input section in the second CML buffering unit 210 receives the second data signal DATA_SIG2 among the plurality of data signals DATA_SIG<1:N> during an interval in which the first multi-phase source clock CLKB is inactivated and the second multi-phase source clock CLK is activated.

Furthermore, the first buffering section 204 in the first CML buffering unit 200 buffers the first data signal DATA_SIG1, inputted through the first data input section 202, to the CML level during an interval in which the first multi-phase source clock CLKB is inactivated and the second multi-phase source clock CLK is activated, and outputs the first buffered data signals BUF_CML_DATA_SIG1 and /BUF_CML_DATA_SIG1. However, the second buffering section in the second CML buffering unit 210 buffers the second data signal DATA_SIG2, inputted through the second data input section, to the CML level during an interval in which the first multi-phase source clock CLKB is activated and the second multi-phase source clock CLK is inactivated, and outputs the second buffered data signals BUF_CML_DATA_SIG2 and /BUF_CML_DATA_SIG2.

As a consequence, it can be understood that, when the plurality of data signals DATA_SIG<1:N> are applied in series, the first CML buffering unit 200 and the second CML buffering unit 210 receive the data signals DATA_SIG<1:N> in a parallelized pattern by changing the input timing of the data signals DATA_SIG<1:N> and by buffering the data signals DATA_SIG<1:N> within the CML region regardless of the state of the swing region of the data signals DATA_SIG<1:N> inputted.

Figure 4:
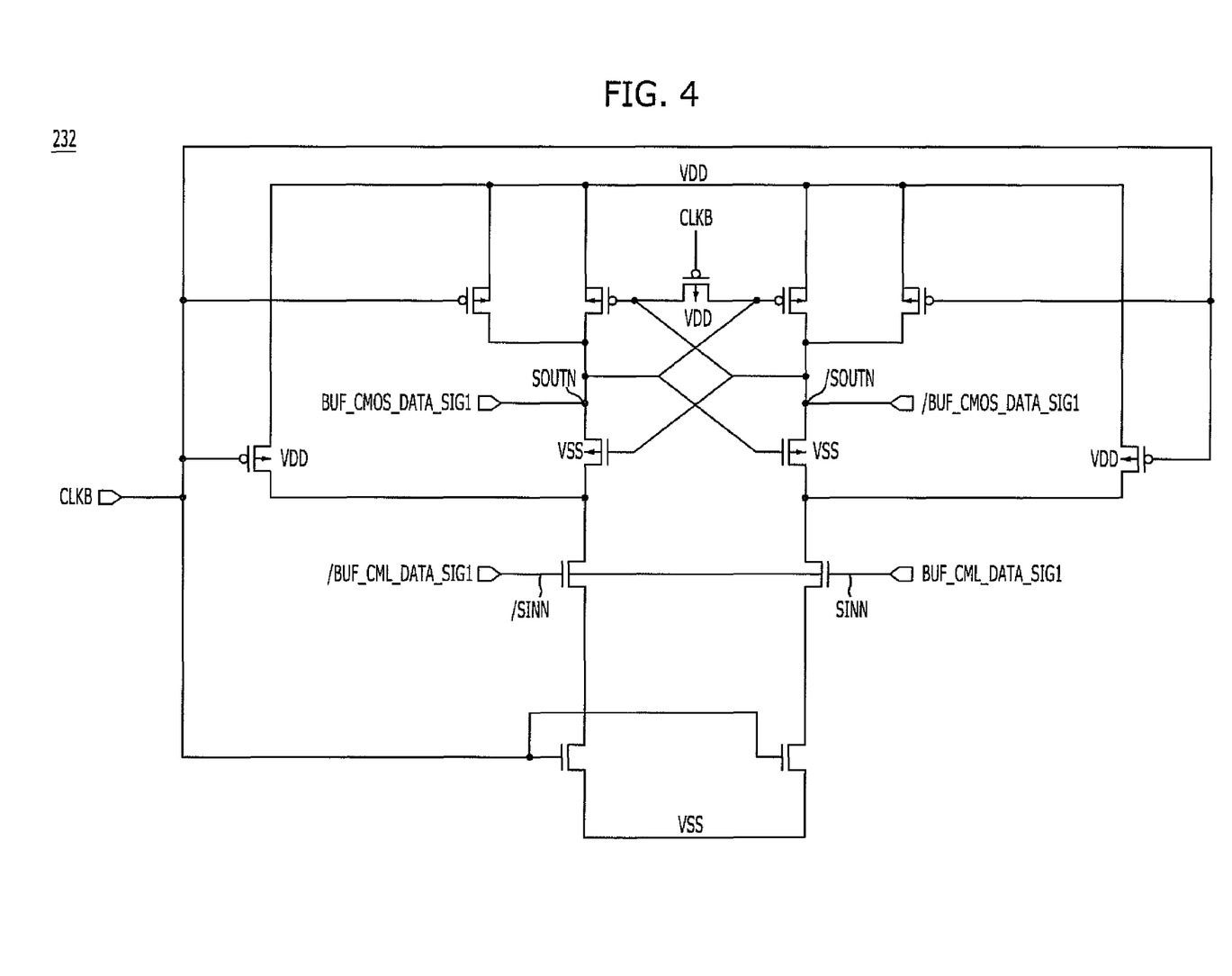
FIG. 4 is a circuit diagram illustrating a first sequential amplification unit among the component elements of the circuit for receiving data in a semiconductor device in accordance with the embodiment of the present invention shown in FIG. 2.

FIG. 4 is a circuit diagram illustrating the first sequential amplification unit among the component elements of the circuit for receiving data in a semiconductor device in accordance with the embodiment of the present invention shown in FIG. 2.

For reference, it is to be noted that the first sequential amplification unit (SAFF) 232 in accordance with the embodiment of the invention shown in FIG. 4 is a sense-amplifier type flip-flop which is frequently used in a conventional semiconductor device.

Below is a brief description of the operations of the sense-amplifier type flip-flop with reference to FIG. 4. In a state in which the voltage levels of output nodes SOUTN and /SOUTN are equalized with the applied clock CLKB inactivated, by sense-amplifying a difference in the voltage levels of input nodes SINN and /SINN with the applied clock CLK activated, the voltage levels of the output nodes SOUTN and /SOUTN are caused to swing between the level of the power supply voltage VDD and the ground voltage VSS. In other words, if the first buffered data signals BUF_CML_DATA_SIG1 and /BUF_CML_DATA_SIG1 applied through the input nodes SINN and /SINN have a specific level difference, it is possible to output first amplified data signals BUF_CMOS_DATA_SIG1 and /BUF_CMOS_DATA_SIG1 that swing in a CMOS region, through the output nodes SOUTN and /SOUTN.

Therefore, the first sequential amplification unit (SAFF) 232 in accordance with the embodiment of the invention performs operations of sense-amplifying the first buffered data signals BUF_CML_DATA_SIG1 and /BUF_CML_DATA_SIG1 outputted from the first CML buffering unit 200 and buffered to the CML level in response to the activation of the first multi-phase source clock CLKB, and outputting the first amplified data signals BUF_CMOS_DATA_SIG1 and /BUF_CMOS_DATA_SIG1, which swing in the CMOS region.

Further, while not directly shown in the drawings, the second sequential amplification section (SAFF) 242 performs operations of sense-amplifying the second buffered data signals BUF_CML_DATA_SIG2 and /BUF_CML_DATA_SIG2 outputted from the second CML buffering unit 210 and buffered to the CML level in response to the activation of the second multi-phase source clock CLK, and outputting the second amplified data signals BUF_CMOS_DATA_SIG2 and /BUF_CMOS_DATA_SIG2, which swing in the CMOS region.

Because the other operations of the sense-amplifier type flip-flop shown in FIG. 4 except the above-described operations are apparent to a person of ordinary skill in the art, detailed descriptions thereof will be omitted herein.

Figure 5:
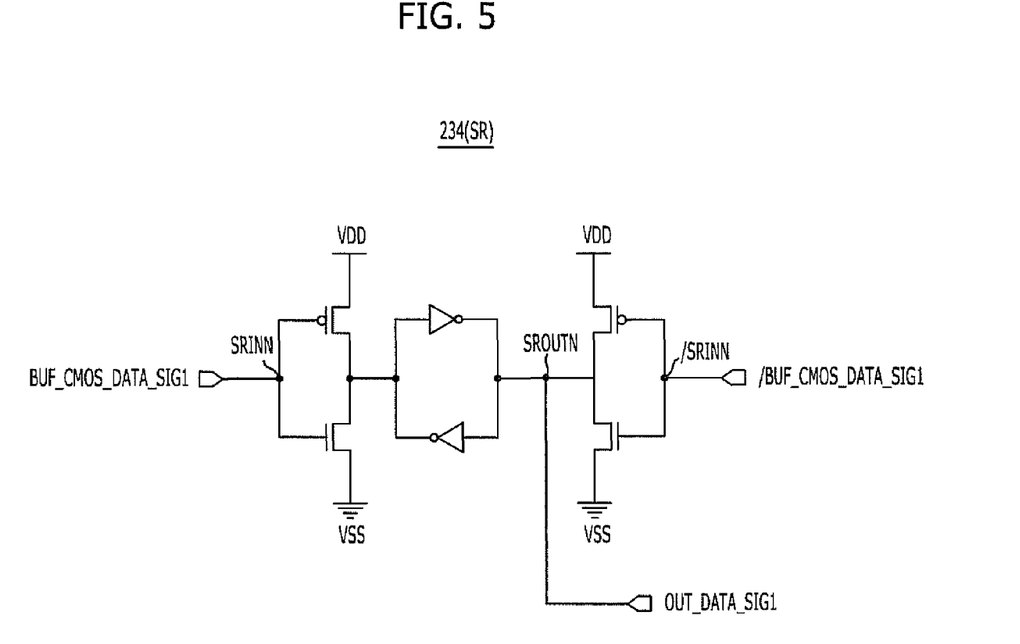
FIG. 5 is a circuit diagram illustrating only an 'SR' section of a first synchronization output unit among the component elements of the circuit for receiving data in a semiconductor device in accordance with the embodiment of the present invention shown in FIG. 2.

FIG. 5 is a circuit diagram illustrating only an 'SR' section of the first synchronization output unit among the component elements of the circuit for receiving data in a semiconductor device in accordance with the embodiment of the present invention shown in FIG. 2.

For reference, it is to be noted that an 'SR' section of the first synchronization output unit (SAFF+SR) 234 in accordance with the embodiment of the invention shown in FIG. 5 is a set-reset type latch which is frequently used in a conventional semiconductor device.

Below is a brief description of the operations of the set-reset type latch with reference to FIG. 5. Here, it is assumed that the first amplified data signal BUF_CMOS_DATA_SIG1 inputted through a positive input terminal SRINN and the first amplified data signal /BUF_CMOS_DATA_SIG1 inputted through a negative input terminal /SRINN have opposite logic levels. Under this assumption, the logic level of an output terminal SROUTN is controlled to be a logic 'high' when the logic level of the first amplified data signal BUF_CMOS_DATA_SIG1 inputted through the positive input terminal SRINN is a logic 'high' and the logic level of the first amplified data signal /BUF_CMOS_DATA_SIG1 inputted through the negative input terminal /SRINN is a logic 'low.' Also, under this assumption, the logic level of an output terminal SROUTN is controlled to be a logic 'low' when the logic level of the first amplified data signal BUF_CMOS_DATA_SIG1 inputted through the positive input terminal SRINN is a logic 'low' and the logic level of the first amplified data signal /BUF_CMOS_DATA_SIG1 inputted through the negative input terminal /SRINN is a logic 'high'.

Therefore, operations for converting the first amplified input signals BUF_CMOS_DATA_SIG1 and /BUF_CMOS_DATA_SIG1, inputted in a differential state, into the output signal OUT_DATA_SIG1 of a single state, and for latching the logic levels thereof are performed.

The set-reset type latch shown in FIG. 5 does not belong to a circuit of which operational state is determined in response to a clock signal. Accordingly, once the voltage levels of the first amplified data signals BU F_CMOS_DATA_SIG1 and /BUF_CMOS_DATA_SIG1 applied to the set-reset type latch by the operations of the sense-amplifier type flip-flop shown in FIG. 4 are determined, the logic level of the output signal OUT_DATA_SIG1 is immediately determined.

Thus, the 'SR' section of the first synchronization output unit (SAFF+SR) 234 in accordance with the embodiment of the invention determines the logic level of the output signal OUT_DATA_SIG1 during the activation interval of the second multi-phase source clock CLK in which the 'SAFF' section of the first synchronization output unit (SAFF+SR) 234 operates.

Similarly, while not directly shown in the drawings, the second synchronization output unit (SR) 244 in accordance with the embodiment of the invention determines the logic level of the output signal OUT_DATA_SIG2 during the activation interval of the second multi-phase source clock CLK in which the second sequential amplification unit (SAFF) 242 operates.

Namely, it can be appreciated that first synchronization output unit (SAFF+SR) 234 and the second synchronization output unit (SR) 244 in accordance with the embodiment of the invention determine the logic levels of the output signals OUT_DATA_SIG1 and OUT_DATA_SIG2 at the same timing during the activation interval of the second multi-phase source clock CLK.

The reason why such a set-reset type latch is included in the design according to the embodiment of the invention is because it is assumed that both the input data signals DATA_SIG<1:N> and output data signals OUT_DATA_SIG<1:N> in the embodiment of the invention are basically maintained at a single state.

Therefore, if it is assumed that both the input data signals DATA_SIG<1:N> and the output data signals OUT_DATA_SIG<1:N> in the embodiment of the invention are maintained at a differential state, the set-reset type latch may not be included in the embodiment of the invention.

Since the other operations of the set-reset type latch shown in FIG. 5 except the above-described operations are apparent to a person of ordinary skill in the art, detailed descriptions thereof will be omitted herein.

In the above-described embodiment, as can be readily seen from the circuits shown in FIGS. 2 through 5, it can be understood that two clocks having opposite phases are included in the multi-phase source clocks CLK and CLKB, and thus, only two data signals are inputted at a time even though the number of the applied data signals DATA_SIG<1:N> exceeds two.

The term, multi-phase, with respect to the multi-phase source clocks CLK and CLKB means that the number of clocks included therein not only may be two as in the aforementioned embodiment of the invention, but also may exceed two.

Hence, the embodiment of the invention shown in FIG. 2 may be applied in the following modified form as the number of the clocks included in the multi-phase source clocks increases.

Figure 6A:
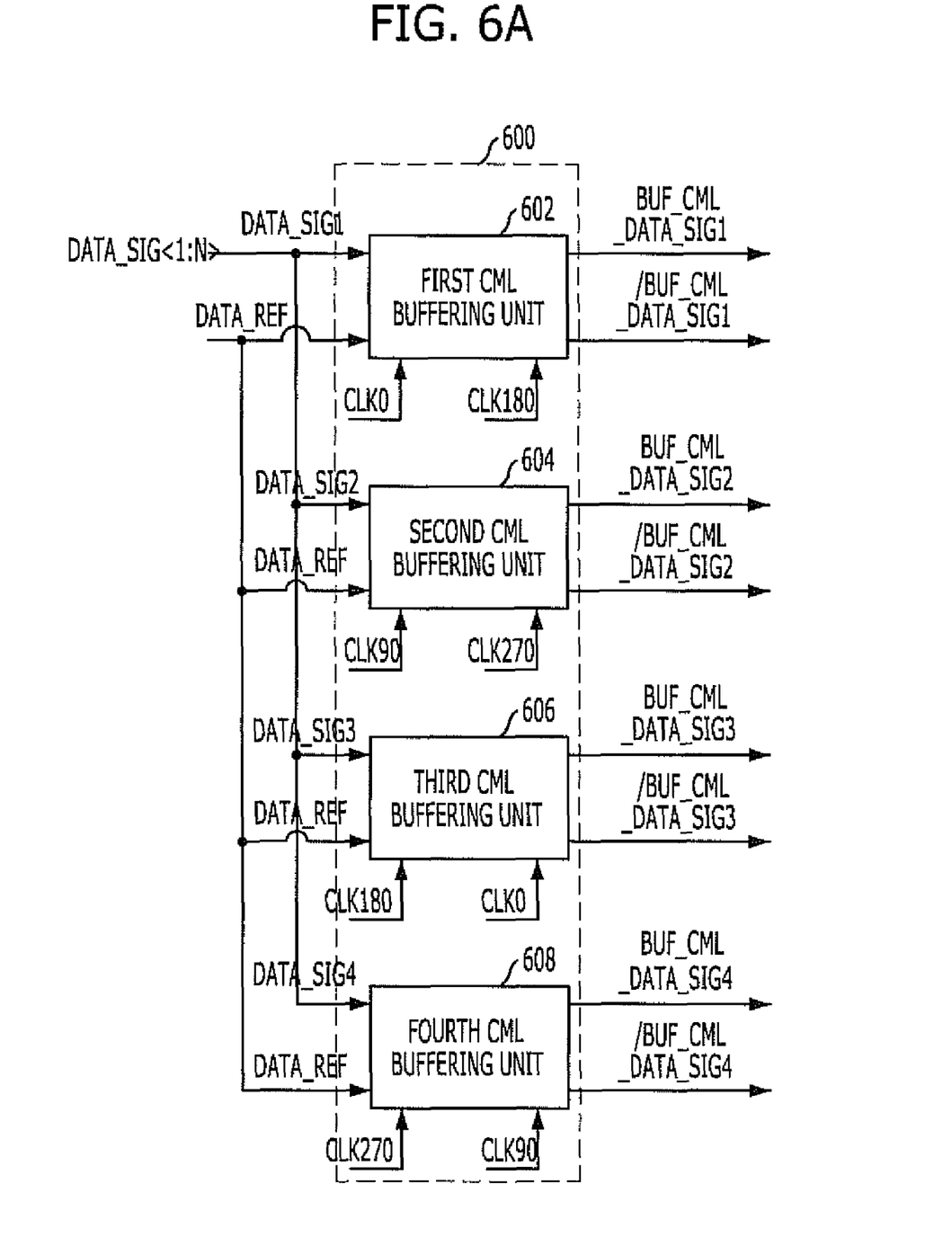
FIGS. 6A and 6B are block diagrams illustrating a circuit for receiving data in a semiconductor device in accordance with another embodiment of the present invention.
Figure 6B:
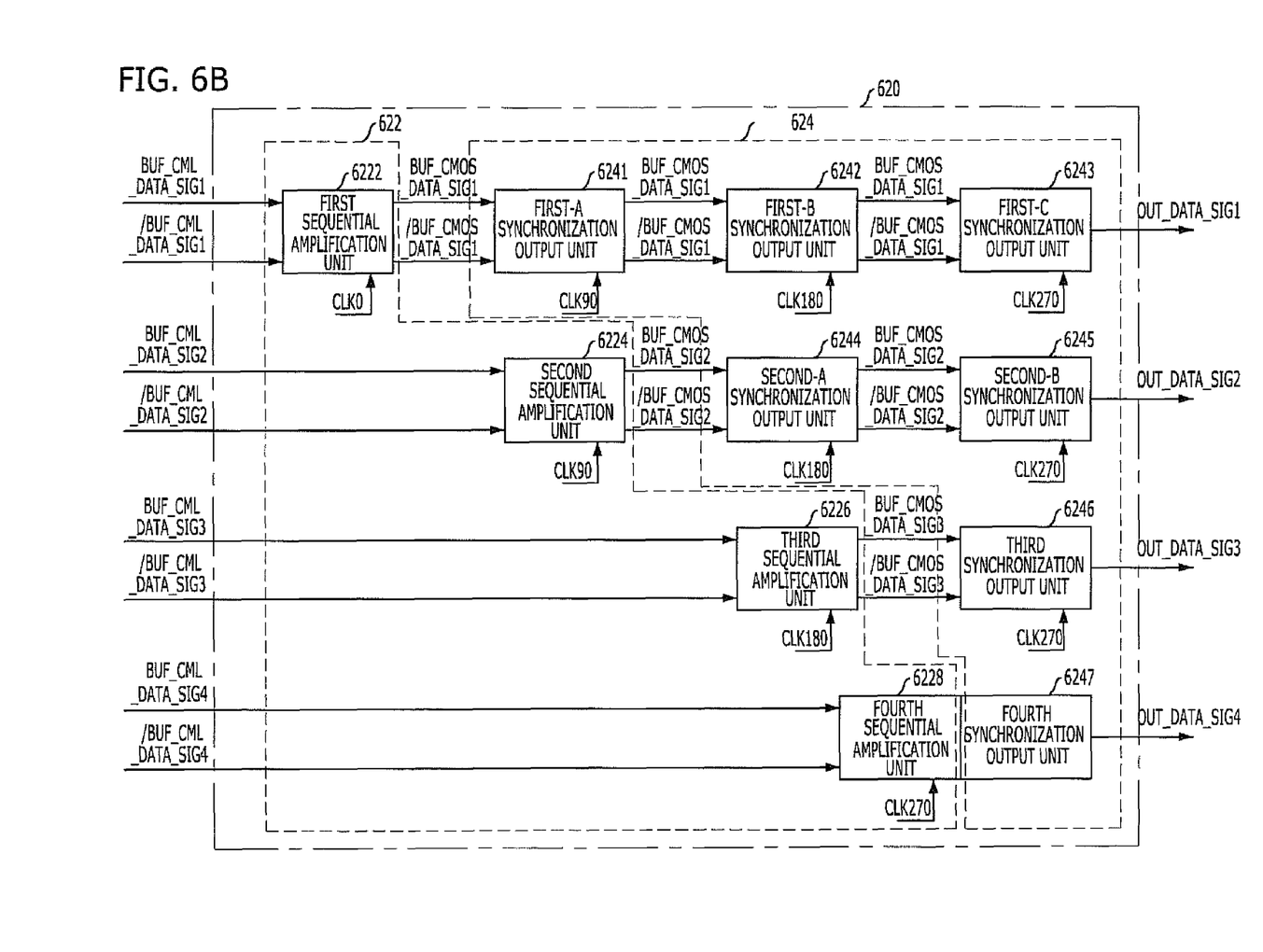

FIGS. 6A and 6B are block diagrams illustrating a circuit for receiving data in a semiconductor device in accordance with another embodiment of the present invention.

For reference, the circuit for receiving data in a semiconductor device in accordance with another embodiment of the present invention shown in FIGS. 6A and 6B is based on the assumption that four clocks CLK0, CLK90, CLK180 and CLK270 respectively having a phase difference of 90° are included in the multi-phase source clocks. Also, while not directly shown in the drawings, it is to be noted that a further increase in the number of source clocks included in the multi-phase source clocks is conceivable as well.

In the case that four clocks CLK0, CLK90, CLK180 and CLK270 are included in the multi-phase source clocks, the clock CLK0 may have a phase earlier than the clock CLK90, the clock CLK90 may have a phase earlier than the clock CLK180, and the clock CLK180 may have a phase earlier than the clock CLK270. In other words, the clock CLK90 has a phase later than the clock CLK0, the clock CLK180 has a phase later than the clock CLK90, and the clock CLK270 has a phase later than the clock CLK0. Therefore, the clock CLK0 has the earliest phase among the multi-phase source clocks, and the clock CLK270 has the latest phase among the multi-phase source clocks.

The circuit for receiving data in a semiconductor device in accordance with another embodiment of the present invention includes a CML buffering block 600 further including a plurality of CML buffering units 602, 604, 606 and 608, as shown FIG. 6A, and a CMOS amplification block 620, as shown in FIG. 6B. As shown in FIG. 6A, the plurality of CML buffering units 602, 604, 606 and 608 are configured to buffer a plurality of serially applied data signals DATA_SIG<1:N>, including DATA_SIG1, DATA_SIG2, DATA_SIG3 and DATA_SIG4, in parallel to CML levels in a sequence responding to the multi-phase source clocks CLK0, CLK90, CLK180 and CLK270. The CML buffering units 602, 604, 606 and 608 are also configured to output buffered data signals BUF_CML_DATA_SIG1, /BUF_CML_DATA_SIG1, BUF_CML_DATA_SIG2, /BUF_CML_DATA_SIG2, BUF_CML_DATA_SIG3, /BUF_CML_DATA_SIG3, BUF_CML_DATA_SIG4, and /BUF_CML_DATA_SIG4. As shown in FIG. 6B, the CMOS amplification block 620 is configured to amplify the plurality of buffered data signals BUF_CM L_DATA_SIG1, /BUF_CML_DATA_SIG1, BUF_CML_DATA_SIG2, /BUF_CML_DATA_SIG2, BUF_CML_DATA_SIG3, /BUF_CML_DATA_SIG3, BUF_CML_DATA_SIG4, and /BUF_CML_DATA_SIG4, sequentially outputted from the plurality of CML buffering units 602, 604, 606 and 608, to CMOS levels in response to the respective multi-phase source clocks CLK0, CLK90, CLK180 and CLK270. The CMOS amplification block 620 is also configured to generate, in parallel, amplified data signals BUF_CMOS_DATA_SIG1, /BUF_CMOS_DATA_SIG1, BUF_CMOS_DATA_SIG2, /BUF_CMOS_DATA_SIG2, BUF_CMOS_DATA_SIG3, /BUF_CMOS_DATA_SIG3, BUF_CMOS_DATA_SIG4 and /BUF_CMOS_DATA_SIG4 at the same timing.

The CMOS amplification block 620 includes a sequential amplification unit 622, and a synchronization output unit 624. The sequential amplification unit 622 is configured to amplify the voltage levels of the plurality of buffered data signals BUF_CML_DATA_SIG1, /BUF_CML_DATA_SIG1, BUF_CML_DATA_SIG2, /BUF_CML_DATA_SIG2, BUF_CML_DATA_SIG3, /BUF_CML_DATA_SIG3, BU F_CM L_DATA_SIG4, and /BUF_CML_DATA_SIG4 in that sequence outputted from the plurality of CML buffering units 602, 604, 606, and 608 to the CMOS levels in response to any one clock among the multi-phase source clocks CLK0, CLK90, CLK180, and CLK270, and output the amplified data signals BUF_CMOS_DATA_SIG1, /BUF_CMOS_DATA_SIG1, BUF_CMOS_DATA_SIG 2, /BUF_CMOS_DATA_SIG2, BUF_CMOS_DATA_SIG 3, /BUF_CMOS_DATA_SIG3, BUF_CMOS_DATA_SIG4, and /BUF_CMOS_DATA_SIG4. The synchronization output unit 624 is configured to output the plurality of amplified data signals BUF_CMOS_DATA_SIG1, /BUF_CMOS_DATA_SIG1, BUF_CMOS_DATA_SIG2, /BUF_CMOS_DATA_SIG2, BUF_CMOS_DATA_SIG3, /BUF_CMOS_DATA_SIG3, BUF_CMOS_DATA_SIG4 and /BUF_CMOS_DATA_SIG4 sequentially amplified to the CMOS levels by the sequential amplification unit 622, in parallel at the same timing in response to different groupings of clocks (for example, a first group including clocks CLK90, CLK180, and CLK270; a second group including clocks CLK180 and CLK270; and a third group including only clock CLK270) which have phases the same as or later than the one clock among the multi-phase source clocks CLK0, CLK90, CLK180 and CLK270.

When the one clock among the multi-phase source clocks CLK0, CLK90, CLK180, and CLK270 is the clock CLK0, CLK90, or CLK180 which has a relatively early phase, the sequential amplification unit 622 amplifies the buffered data signals BUF_CML_DATA_SIG1, /BUF_CML_DATA_SIG1, BUF_CML_DATA_SIG2, /BUF_CML_DATA_SIG2, BUF_CML_DATA_SIG3, and /BUF_CML_DATA_SIG3, outputted relatively early among the plurality of buffered data signals BUF_CML_DATA_SIG1, /BUF_CML_DATA_SIG1, BUF_CML_DATA_SIG2, /BUF_CML_DATA_SIG2, BUF_CML_DATA_SIG3, /BUF_CML_DATA_SIG3, BUF_CML_DATA_SIG4, and /BUF_CML_DATA_SIG4 sequentially outputted from the plurality of CML buffering units 602, 604, 606, and 608, to the CMOS levels in response to the clock CLK0, CLK90, or CLK180 which has a relatively early phase. Also, when the one clock among the multi-phase source clocks CLK0, CLK90, CLK180, and CLK270 is the clock CLK90, CLK180, or CLK270 which has a relatively late phase, the sequential amplification unit 622 amplifies the buffered data signals BUF_CML_DATA_SIG2, /BUF_CML_DATA_SIG2, BUF_CML_DATA_SIG3, /BUF_CML_DATA_SIG3, BUF_CML_DATA_SIG4, and /BUF_CML_DATA_SIG4, outputted relatively late among the plurality of buffered data signals BUF_CML_DATA_SIG1, /BUF_CML_DATA_SIG1, BUF_CML_DATA_SIG2, /BUF_CML_DATA_SIG2, BUF_CML_DATA_SIG3, /BUF_CML_DATA_SIG3, BUF_CML_DATA_SIG4, and /BUF_CML_DATA_SIG4 sequentially outputted from the plurality of CML buffering units 602, 604, 606, and 608, to the CMOS levels in response to the clock CLK90, CLK180, or CLK270 which has a relatively late phase.

When the one clock among the multi-phase source clocks CLK0, CLK90, CLK180, and CLK270 is the clock CLK0, CLK90, or CLK180 which has a relatively early phase, the synchronization output unit 624 latches the amplified data signals BUF_CMOS_DATA_SIG1, /BUF_CMOS_DATA_SIG1, BUF_CMOS_DATA_SIG2, /BUF_CMOS_DATA_SIG2, BUF_CMOS_DATA_SIG3, and /BUF_CMOS_DATA_SIG3 amplified to the CMOS levels in response to the clock signal which has a relatively early phase, for a duration in which groups of clocks (for example, a first group including clocks CLK90, CLK180 and CLK270; a second group including clocks CLK180 and CLK270; or a third group including clocks CLK270), having phases later than the one clock CLK0, CLK90 or CLK180 among the multi-phase source clocks, are sequentially activated. The synchronization output unit 624 then outputs data signals OUT_DATA_SIG1, OUT_DATA_SIG2, and OUT_DATA_SIG3 during the activation interval of the clock CLK270 having the relatively latest phase among the multi-phase source clocks. Also, when the one clock among the multi-phase source clocks CLK0, CLK90, CLK180 and CLK270 is the clock CLK270, which has the relatively latest phase, the synchronization output unit 624 outputs the amplified data signals BUF_CMOS_DATA_SIG4 and /BUF_CMOS_DATA_SIG4 amplified to the CMOS levels in response to the clock CLK270 which has the relatively latest phase, as the data signal OUT_DATA_SIG4 at the same time as they are amplified.

The detailed circuit configuration of the respective CML buffering units 602, 604, 606, and 608 is the same as the detailed circuit configuration of the first CML buffering unit 200 shown in FIG. 3. With reference to FIG. 3, each CML buffering unit 602, 604, 606, and 608 includes a data input section and a buffering section. The data input section is configured to receive any one data signal DATA_SIG1, DATA_SIG2, DATA_SIG3, or DATA_SIG4 among the plurality of data signals DATA_SIG<1:N> in response to any one clock among the multi-phase source clocks CLK0, CLK90, CLK180 and CLK270. Furthermore, the buffering section is configured to buffer a signal inputted through the data input section to a CML level in response to a clock CLK180, CLK270, CLK0, or CLK90 which has a phase opposite to the one clock among the multi-phase source clocks CLK0, CLK90, CLK180, and CLK270. For example, if the data input section uses the clock CLK0, CLK90, CLK180, or CLK270, then the buffering section uses the clock CLK180, CLK270, CLK0, or CLK90, respectively.

The data input section performs an operation of determining the logic level of the one data signal DATA_SIG1, DATA_SIG2, DATA_SIG3, or DATA_SIG4 of the plurality of data signals DATA_SIG<1:N>, inputted during the activation interval of the one clock among the multi-phase source clocks CLK0, CLK90, CLK180, and CLK270, based on the voltage level of a data reference signal DATA_REF. However, the data input section does not determine the logic level of the one data signal DATA_SIG1, DATA_SIG2, DATA_SIG3, or DATA_SIG4 during the inactivation interval of the one clock CLK0, CLK90, CLK180, or CLK270, irrespective of whether the one data signal DATA_SIG1, DATA_SIG2, DATA_SIG3, or DATA_SIG4 of the plurality of data signals DATA_SIG<1:N> is inputted or not.

The buffering section sense-amplifies the voltage level of the one data signal DATA_SIG1, DATA_SIG2, DATA_SIG3, or DATA_SIG4 of the plurality of data signals DATA_SIG<1:N>, inputted through the data input section, during the activation interval of the clock CLK180, CLK270, CLK0, or CLK90, which has a phase opposite to the one clock CLK0, CLK90, CLK180 or CLK270, respectively, to the CML levels. However, the buffering section does not sense-amplify the voltage level of the one data signal DATA_SIG1, DATA_SIG2, DATA_SIG3, or DATA_SIG4 to the CML region during the inactivation interval of the clock CLK180, CLK270, CLK0, or CLK90, which has a phase opposite to the one clock CLK0, CLK90, CLK180 or CLK270, respectively, regardless whether the one data signal DATA_SIG1, DATA_SIG2, DATA_SIG3 or DATA_SIG4 of the plurality of data signals DATA_SIG<1:N> is inputted or not through the data input section.

Figure 7:
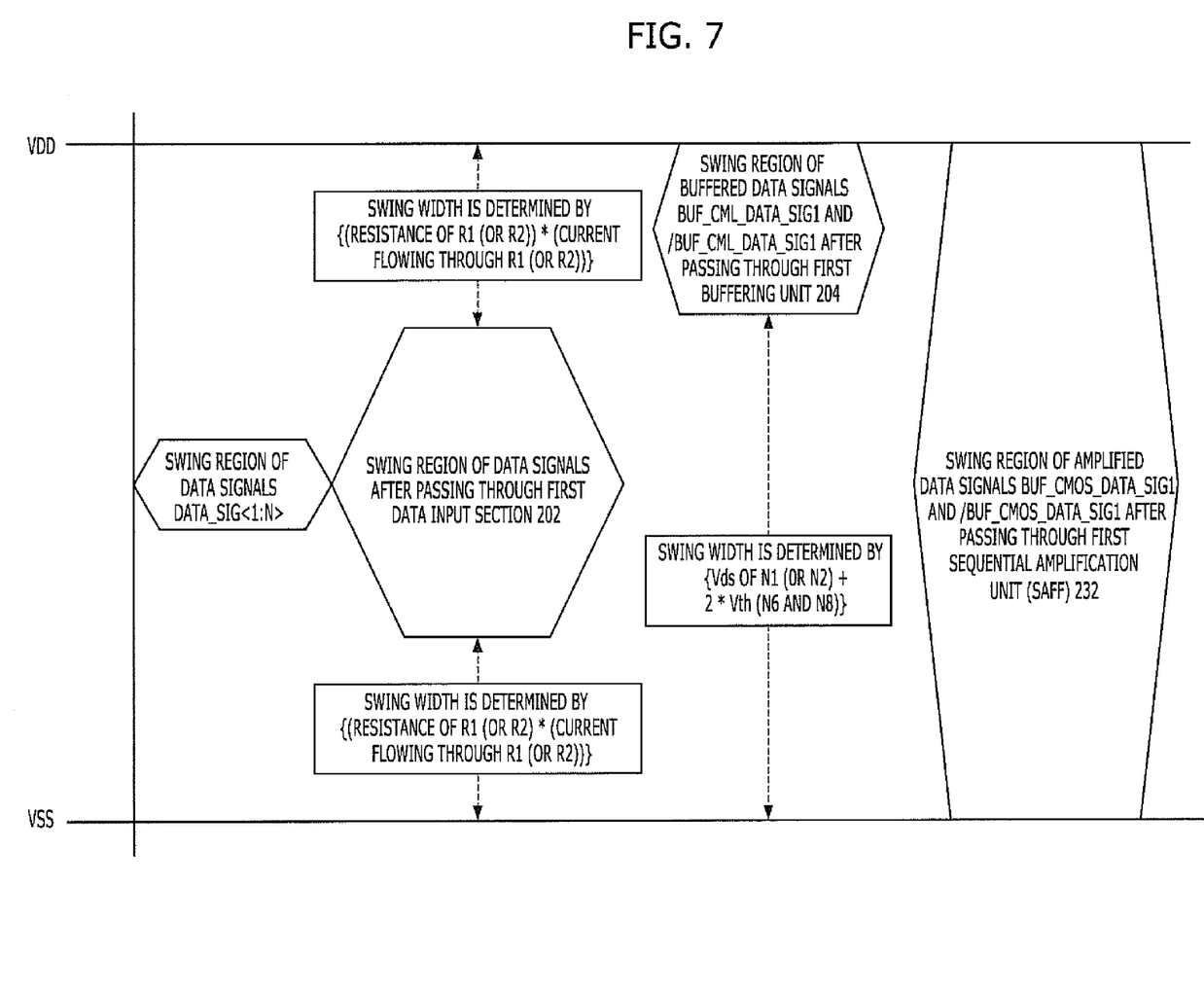
FIG. 7 is a timing diagram comparatively illustrating swing regions of signals inputted and outputted in conformity with operations of the component elements of the circuit for receiving data in a semiconductor device in accordance with the embodiment of the present invention shown in FIGS. 2 through 5.

FIG. 7 is a timing diagram comparatively illustrating swing regions of signals inputted and outputted in conformity with operations of the component elements of the circuit for receiving data in a semiconductor device in accordance with the embodiment of the present invention, shown in FIGS. 2 through 5.

Referring to FIG. 7, it is assumed that a significant amount of the swing width of the external data signals DATA_SIG<1:N> is lost during transmission, and the external data signals DATA_SIG<1:N> have an arbitrarily set voltage level.

As can be seen from FIG. 7, the swing width of the external data signals DATA_SIG<1:N> is significantly amplified as a result of passing the external data signals DATA SIG<1:N> through the first data input section 202 provided in the first CML buffering unit 200, but the external data signals still DATA_SIG<1:N> do not still swing in the CML region. However, after passing through the first buffering section 204, the external data signals DATA_SIG<1:N> stably swing in the CML region.

Thereafter, the CML buffered data signals BUF_CML_DATA_SIG1 and /BUF_CML_DATA_SIG1 are converted into the CMOS amplified data signals BUF_CMOS_DATA_SIG1 and /BUF_CML_DATA_SIG1, as a result of passing through the first sequential amplification unit (SAFF) 232 provided in the first CMOS amplification block 230.

As described above, in accordance with the embodiments of the present invention, the external data signals are received after being buffered in the CML region, and thus, they may be stably received even when power noise occurs in the semiconductor device.

Moreover, since the external data signals are buffered in the CML region, the possibility of losing the external data signals is reduced, thereby minimizing the possibility that data will be lost.

Furthermore, the respective data may have a relatively larger setup time and hold time (tDSH), even though power noise does not occur in the semiconductor device.

As is apparent from the above description, the present invention provides advantages in that, since external data applied from outside a semiconductor device is first buffered at a CML region, the data can be stably received even when power noise occurs in the semiconductor device.

Also, because data loss can be minimized through the process of buffering the external data at the CML region, the data can be received with increased reliability even though power noise does not occur in the semiconductor device.

While the present invention has been described with respect to the specific embodiments, it will be apparent to those skilled in the art that various changes and modifications may be made without departing from the spirit and scope of the invention as defined in the following claims.

For example, it is apparent that the logic gates and the transistors exemplified in the aforementioned embodiments may have different positions and kinds depending upon the polarities of the signals inputted thereto.

What is claimed is:

1. A semiconductor device comprising:
 a plurality of CML buffering units configured to buffer, in parallel, a plurality of serially applied data signals to CML levels in a sequence responding to multi-phase source clocks; and
 a CMOS amplification block configured to amplify a plurality of buffered data signals, sequentially outputted from the plurality of CML buffering units, to CMOS levels in response to the multi-phase source clocks, and output amplified data signals in parallel at the same timing.

2. The semiconductor device of claim 1, wherein each of the plurality of CML buffering units comprises:
 a data input section configured to receive any one data signal among the plurality of data signals in response to any one clock among the multi-phase source clocks; and
 a buffering section configured to buffer a signal inputted through the data input section, to a CML level in response to a clock which has a phase opposite to the one clock among the multi-phase source clocks.

3. The semiconductor device of claim 2, wherein the data input section determines a logic level of the one data signal, inputted thereto among the plurality of data signals, based on a voltage level of a data reference signal, during an activation interval of the one clock of the multi-phase source clocks.

4. The semiconductor device of claim 3, wherein the data input section does not determine a logic level of the one data signal among the plurality of data signals, during an inactivation interval of the one clock of the multi-phase source clocks, irrespective of whether the one data signal is inputted thereto or not.

5. The semiconductor device of claim 4, wherein the buffering section sense-amplifies a voltage level of the one data signal among the plurality of data signals, which is inputted through the data input section, to a CML level during an activation interval of a clock, which has a phase opposite to that of the one clock among the multi-phase source clocks.

6. The semiconductor device of claim 4, wherein the buffering section does not sense-amplify a voltage level of the one data signal among the plurality of data signals, to a CML level during an inactivation interval of a clock, which has a phase opposite to that of the one clock among the multi-phase source clocks, irrespective of whether the one data signal is inputted or not through the data input section.

7. The semiconductor device of claim 2, wherein the CMOS amplification block comprises:
 a sequential amplification unit configured to amplify voltage levels of the plurality of buffered data signals, sequentially outputted from the plurality of CML buffering units, to CMOS levels in response to the one clock among the multi-phase source clocks; and
 a synchronization output unit configured to output, in parallel, the plurality of buffered data signals, sequentially amplified to the CMOS levels by the sequential amplification unit, at the same timing in response to respective clocks, which have phases the same as or later than that of the one clock among the multi-phase source clocks.

8. The semiconductor device of claim 7,
 wherein, when the one clock has an earlier phase than the other multi-phase source clocks, the sequential amplification unit amplifies a data signal, which is outputted earlier than the other data signals of the plurality of data signals sequentially outputted from the plurality of respective CML buffering units, to a CMOS level in response to the one clock, and
 wherein, when the one clock has a later phase than the other multi-phase source clocks, the sequential amplification unit amplifies a data signal, which is outputted later than the other data signals of the plurality of data signals sequentially outputted from the plurality of respective CML buffering units, to a CMOS level in response to the one clock.

9. The semiconductor device of claim 8, wherein, when the one clock has an earlier phase than the other multi-phase source clocks, the synchronization output unit latches the buffered data signals amplified to the CMOS levels in response to the one clock, for a duration in which clocks having phases later than the one clock are sequentially activated, and then outputs data signals during an activation interval of a clock having a latest phase among the multi-phase source clocks.

10. The semiconductor device of claim 9, wherein, when the one clock is a clock having the latest phase, the synchronization output unit outputs the buffered data signals amplified to the CMOS levels in response to the clock having the latest phase, as the data signals at the same time that they are amplified.

11. A semiconductor device comprising:
 a first CML buffering unit configured to buffer a first data signal, which is applied first among a plurality of serially applied data signals, to a CML level in synchronism with multi-phase source clocks;
 a second CML buffering unit configured to buffer a second data signal, which is applied second among the plurality of data signals, to a CML level in synchronism with the multi-phase source clocks;
 a first CMOS amplification block configured to amplify a first buffered data signal outputted from the first CML buffering unit, to a CMOS level in response to the multi-phase source clocks to obtain an amplified first buffered data signal, and output the amplified first buffered data signal at a certain output timing; and
 a second CMOS amplification block configured to amplify a second buffered data signal outputted from the second CML buffering unit, to a CMOS level in response to the multi-phase source clocks to obtain an amplified second buffered data signal, and output the amplified second buffered data signal at the certain output timing.

12. The semiconductor device of claim 11, wherein the multi-phase source clocks are composed of a first multi-phase source clock, which has a first phase, and a second multi-phase source clock, which has a second phase that is lower than the first phase, and the first multi-phase source clock and the second multi-phase source clock have opposite activation intervals.

13. The semiconductor device of claim 12, wherein the first CML buffering unit comprises:
 a first data input section configured to receive the first data signal among the plurality of serially applied data signals in response to the first multi-phase source clock; and
 a first buffering section configured to buffer a signal inputted from the first data input section, to the CML level in response to the second multi-phase source clock.

14. The semiconductor device of claim 13, wherein the second CML buffering unit comprises:
 a second data input section configured to receive the second data signal among the plurality of serially applied data signals in response to the second multi-phase source clock; and
 a second buffering section configured to buffer a signal inputted from the second data input section, to the CML level in response to the first multi-phase source clock.

15. The semiconductor device of claim 14, wherein the first data input section receives the first data signal among the plurality of serially applied data signals, during an interval in which the first multi-phase source clock is activated and the second multi-phase source clock is inactivated, and the second data input section receives the second data signal among the plurality of serially applied data signals, during an interval in which the first multi-phase source clock is inactivated and the second multi-phase source clock is activated.

16. The semiconductor device of claim 15, wherein the first buffering section buffers the signal, inputted from the first data input section, to the CML level during an interval in which the first multi-phase source clock is inactivated and the second multi-phase source clock is activated, and the second buffering section buffers the signal, inputted from the second data input section, to the CML level during an interval in which the first multi-phase source clock is activated and the second multi-phase source clock is inactivated.

17. The semiconductor device of claim 16, wherein the first CMOS amplification block is configured to amplify the first buffered data signal to the CMOS level during an activation interval of the first multi-phase source clock, wait until the certain output timing during an activation interval of the second multi-phase source clock, and output the amplified first buffered data signal.

18. The semiconductor device of claim 17, wherein the second CMOS amplification block is configured to amplify the second buffered data signal to the CMOS level during an activation interval of the second multi-phase source clock, and at the same time, output the amplified second buffered data signal at the certain output timing corresponding to the activation interval of the second multi-phase source clock.

19. A method for operating a semiconductor device, comprising:
applying a plurality of data signals in series;
buffering the plurality of data signals to CML levels at a plurality of sequential timings that are determined in correspondence to multi-phase source clocks, and generating a plurality of CML buffered data signals;
amplifying sequentially the plurality of CML buffered data signals to CMOS levels in response to the multi-phase source clocks, and generating a plurality of CMOS amplified data signals; and
outputting the plurality of CMOS amplified data signals in parallel at one timing that is determined according to the multi-phase source clocks.

20. The method of claim 19, wherein the generating of the plurality of CML buffered data signals comprises:
receiving the plurality of data signals in a manner such that relatively earlier applied data signals are received in response to corresponding clocks having relatively earlier phases, wherein the corresponding clocks are among the multi-phase source clocks; and
sense-amplifying each of the data signals, inputted through the receiving of the plurality of data signals, to a CML level in response to a clock, which has a phase opposite to whichever of the corresponding clocks, from among the multi-phase source clocks, was used in the receiving of each of the data signals, and generating the plurality of CML buffered data signals.

21. The method of claim 20, wherein the generating of the plurality of CMOS amplified data signals comprises:
amplifying sequentially each of the plurality of CML buffered data signals to the CMOS levels in response to a clock, which has the same phase as whichever of the corresponding clocks, from among the multi-phase source clocks, was used in the receiving of the data signals for that particular CML buffered data signal, and generating the plurality of CMOS amplified data signals.

22. The method of claim 21, wherein the outputting of the plurality of CMOS amplified data signals in parallel comprises:
when the clock used in the generating of the CMOS amplified data signals is not a clock which has a latest phase among the multi-phase source clocks, latching the plurality of CMOS amplified data signals for a time in which clocks, having phases later than the clock used in the generating of the CMOS amplified data signals, are sequentially activated, and outputting the plurality of CMOS amplified data signals in response to activation of the clock which has the latest phase; and
when the clock used in the generating of the CMOS amplified data signals is the clock which has the latest phase among the multi-phase source clocks, outputting the plurality of CMOS amplified data signals at the same time as the generating of the CMOS amplified data signals.

* * * * *